United States Patent
Tomzig et al.

[11] Patent Number: 6,001,170
[45] Date of Patent: Dec. 14, 1999

[54] PROCESS AND APPARATUS FOR THE GROWTH OF SINGLE CRYSTALS

[75] Inventors: Erich Tomzig, Burgkirchen; Werner Zulehner; Wilfried Von Ammon, both of Burghausen, all of Germany; Yu M Gelfgat; Leonid Gorbunov, both of Riga, Latvia

[73] Assignee: Wacker Siltronik Gesellschaft für Halbleitermaterialien AG, Burghausen, Germany

[21] Appl. No.: 08/695,315

[22] Filed: Aug. 9, 1996

[30] Foreign Application Priority Data

Aug. 10, 1995 [DE] Germany .......................... 195 29 481

[51] Int. Cl.⁶ .................................................. C30B 15/22
[52] U.S. Cl. .............................. 117/32; 117/208; 117/917
[58] Field of Search ..................................... 117/208, 917, 117/32

[56] References Cited

U.S. PATENT DOCUMENTS

| | | | |
|---|---|---|---|
| 3,607,139 | 9/1971 | Hanks | 117/208 |
| 4,659,423 | 4/1987 | Kim | 117/917 |
| 5,178,720 | 1/1993 | Frederick | 156/618.1 |
| 5,268,063 | 12/1993 | Kaneko | 117/932 |
| 5,349,921 | 9/1994 | Baraclough | 117/32 |
| 5,359,959 | 11/1994 | Fusegawa | 117/917 |
| 5,437,242 | 8/1995 | Hofstetter | 117/208 |

FOREIGN PATENT DOCUMENTS 270728  8/1989  German Dem. Rep. .

OTHER PUBLICATIONS

Derwent Abstract Corresponding to DD 270728.
Magnitnaya Gidrodinamika, Jul.–Sep. 1979, USSR, vol. 15, No. 3, ISSN 0025–0015, pp. 145–146, XP000603324, Ivanov et al. "Electromagnetic excitation of oscillations in a crystallizing bar".
Fifth Hungarian Conference on Crystal Growth HCCG–5, Budapest, Hungary, Nov. 14–16, 1989, vol. 70, No. 3 ISSN 0231–4428, ACTA Physica, 1991 Hungary, pp. 177–181 XP002017107 Bochkarev et al. "Properties of Silicon Single Crystals grown in Magnetic fields" p. 117, col. 1.
Journal of Crystal Growth, vol. 52, 1981, Amsterdam, pp. 524–529 XP000604638, Mikelson et al. "Control of Crystallisation Process by Means of Magnetic Fields".

*Primary Examiner*—Robert Kunemund
*Attorney, Agent, or Firm*—Collard & Roe, P.C.

[57] ABSTRACT

A process for the growth of a single crystal from semiconductor material by the Czochralski method, in which the melt is subjected to the influence of a magnetic field during the crystal growth and the magnetic field is generated by superposing a static magnetic field and an alternating magnetic field. An apparatus for carrying out the process, has a magnetic means which comprises two coils which are arranged around a crucible, one coil generating a static magnetic field and the other coil generating an alternating magnetic field.

17 Claims, 3 Drawing Sheets

PROCESS AND APPARATUS FOR THE GROWTH OF SINGLE CRYSTALS

BACKGROUND OF THE INVENTION

1. Field of the Invention

The present invention relates to a process for the growth of single crystals from semiconductor material by the Czochralski method.

2. The Prior Art

In this method, a cylindrical single crystal grows on a seed crystal, the seed crystal first being immersed in a melt and then drawn away from the surface of the melt. The melt is held in a crucible which consists of a quartz glass crucible and of a support crucible which is usually made of graphite and in which the quartz glass crucible is placed. The crucible rests on a rotatable and axially displaceable shaft and is surrounded laterally by resistance heating elements which generate sufficient heat radiation to melt the solid semiconductor material therein and to keep it in the molten state. In addition to semiconductor material, the melt contains, if required, added dopants and unavoidable amounts of oxygen and other impurities, which are dissolved out of the crucible wall. As a rule, the crucible and the growing single crystal are rotated in opposite directions because this makes it possible to influence to a certain degree the quantitative incorporation of oxygen and the distribution of oxygen and dopants in the melt and in the single crystal.

The melt continuously loses heat mainly via its free surface, the growing single crystal, the bottom of the support crucible and the shaft. This heat loss must be compensated by increasing the heating power of the resistance heating elements. The increased heat supply heats the crucible wall to well above the melting point of the semiconductor material. This is a problem with adverse consequences which are evident in particular in the growth of single crystals having diameters of more than 200 mm, because high heat outputs are required for the growth of such single crystals, due to the correspondingly large crucibles and melt volumes. One consequence is that, due to the high temperatures at the crucible wall, oxygen and other impurities are dissolved to a greater extent out of the crucible material and enter the melt. Another disadvantageous consequence is that island-like cristobalite layers form to an increasing extent on the crucible wall as a result of the overheating of the crucible. As a result of pitting corrosion, these layers may release particles which reach the crystallization boundary with a certain probability via convection flows and can terminate the dislocation-free growth of the single crystal. For this reason, the achievable dislocation-free growth in length of single crystals having large diameters has also been very limited and the ratio of length to diameter in the case of such single crystals is small. A further disadvantageous consequence of too high a temperature at the crucible wall results from the associated large temperature difference between the crucible and the crystallization boundary. It causes the occurrence of powerful uncontrolled material flows in the melt as a result of thermal convection, which lead to local fluctuations in the temperature and in the concentration of dopant and impurities. This situation is of course also reflected in the growing single crystal by an undesirable, locally fluctuating distribution of the dopants and of the impurities, in particular of the oxygen.

In addition, the temperature fluctuations in the melt increase the temperature-related stresses to which the single crystal is exposed during growth. There is an increasing danger that dislocations will form in the region of the crystallization boundary and may spread into the dislocation-free part of the single crystal to a length corresponding to the diameter of the single crystal. Because regions of the crystal which contain dislocations are not suitable for use as a starting material for electronic components, drastic reductions in yield are to be expected particularly in the case of large single crystals where the ratio of length to diameter is, for the stated reasons, in any case small.

For example, DD-270 728 A1 discloses that static magnetic fields superposed on the melt influence material flows and temperature distribution in the melt. Their effect consists in particular in the damping of convective material flows. At suitable field strengths, local temperature fluctuations are reduced and the incorporation of dopant in the single crystal is more homogeneous. However, the magnets required for generating magnetic fields having suitable field strengths are complicated in design and their energy requirement is relatively high. The above-mentioned publication and U.S. Pat. No. 5,178,720 therefore give preference to processes which operate with rotating magnetic fields. According to the process disclosed in U.S. Pat. No. 5,178,720, the incorporation of oxygen into the growing single crystal is controlled on the basis of a sequence according to which certain rotational speeds of single crystal and crucible are to be observed and the intensity of a certain component of the magnetic field is reduced with increasing crystal volume.

In spite of some improvements through the use of static and rotating magnetic fields in the growth of single crystals by the Czochralski method, the situation remains unsatisfactory. In particular, the known processes do not provide an adequate solution to the problems described, which have to be overcome in the growth of single crystals having diameters of more than 200 mm.

SUMMARY OF THE INVENTION

It is an object of the present invention to provide a solution to the prior art problems and to provide a process which is suitable in particular for the growth of large single crystals, which permits a homogeneous distribution of the dopants and of the impurities in the single crystal, with the aid of which the incorporation of oxygen into the single crystal can also be controlled in terms of quantity and by means of which the danger of dislocation formation is greatly reduced.

The above object is achieved according to the present invention by a process for the growth of a single crystal from semiconductor material by the Czochralski method by drawing a seed crystal immersed in a melt away from the surface of the melt, the melt being present up to a certain height in a rotatable quartz glass crucible and being produced by melting solid semiconductor material and optionally dopants, and the melt being subjected to the influence of a magnetic field during the crystal growth, characterized in that the magnetic field is generated by superposing a static magnetic field and an alternating magnetic field.

The present invention is also directed to an apparatus for the preparation of a single crystal from semiconductor material by the Czochralski method, having a receptacle in which a melt-filled crucible and a resistance heating surrounding the crucible are housed, having a drawing means for drawing a single crystal from the melt and having a magnetic means for generating a magnetic field in the melt, characterized in that the magnetic means comprises at least two coils which are arranged around the crucible, one coil generating a static magnetic field and the other coil an alternating magnetic field.

By the combined use of a static and an alternating magnetic field, it is possible to adapt convective material flows and the temperature distribution in the melt to the requirements for optimum crystal growth. By means of the alternating magnetic field, it is possible to introduce inductive energy into the melt without the crucible wall also having to be heated. This makes it possible to generate in a specific manner material flows which promote a homogeneous dopant and oxygen distribution in the melt, especially in the region of the crystallization boundary. The alternating magnetic field is also used as an instrument for controlling the material flows, in that changes in the growth conditions which inevitably result are compensated by a change in the magnetic field or altered growth conditions are deliberately brought about by a change in the magnetic field. The superposed, static magnetic field is in turn required to stabilize the material streams, to effect regulation and to dampen local fluctuations in the flow velocities.

Figure 1:
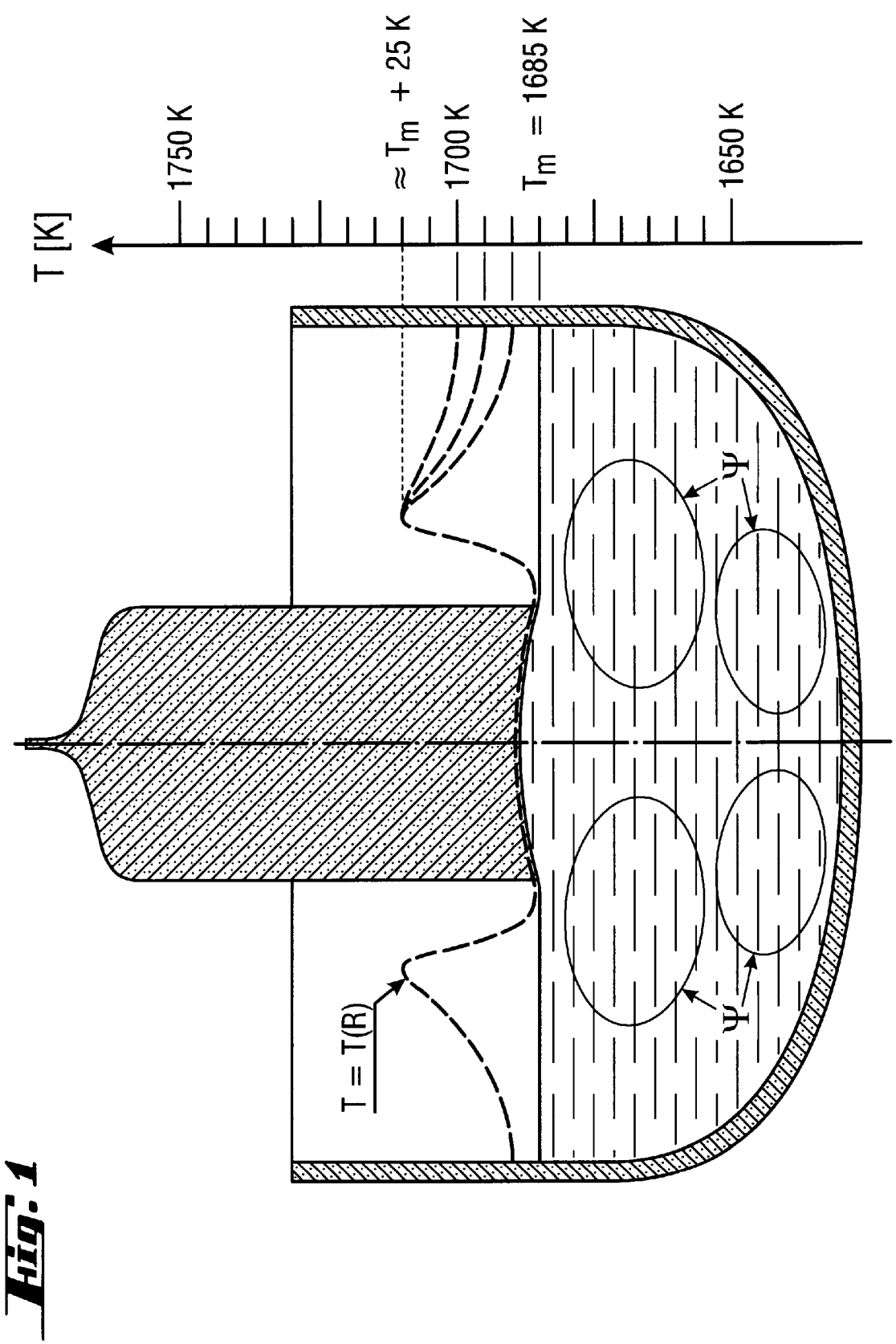
FIG. 1 shows the preferred conditions with regard to the radial temperature distribution and the distribution of convective material flows in the melt.

Other objects and features of the present invention will become apparent from the following detailed description considered in connection with the accompanying drawing which discloses embodiments of the present invention. It should be understood, however, that the drawing is designed for the purpose of illustration only and not as a definition of the limits of the invention.

DETAILED DESCRIPTION OF THE PREFERRED EMBODIMENTS

In order to realize the preferred temperature distribution shown in FIG. 1 and the material flow profile characterized by closed circulations, it is proposed to apply an alternating magnetic field and simultaneously a static magnetic field to the melt. It is particularly preferable to use an axially symmetrical, alternating magnetic field having the relative frequency $\epsilon=2\pi\mu_o\sigma fR^2$, which has a magnetic induction with an amplitude of at least $B_a=C/R$, where $\epsilon$ should be in the low-frequency range from 1 to 1000, preferably from 5 to 50. In the expressions, $\mu_o$ denotes the magnetic permeability in vacuo ($\mu_o=4\pi10^{-7}$ H/m), $\sigma$ denotes the electrical conductivity of the melt, f denotes the alternating current frequency of the power supply for the induction coil which generates the alternating magnetic field, R denotes the radius of the crucible and C denotes a constant whose value is $1\cdot10^{-3}$ T·m. By interaction with the alternating magnetic field, electrical currents are induced in the melt and circulate along azimuthal paths around the axis of rotation of the crucible. Their interaction with the magnetic field is in the end responsible for the occurrence of the convective material flows ψ shown in FIG. 1. By means of the relative frequency $\epsilon$, the intensity and the position of these material flows and hence the expulsion of gaseous silicon monoxide via the free surface of the melt are influenced and finally the incorporation of oxygen into the single crystal is controlled within wide limits.

Because of the ohmic resistance which the melt offers to the induced electrical current, the melt is additionally heated, especially in the region between the single crystal and the crucible wall. The consequence of this is a radial temperature distribution T(R) with a maximum in this region. The preferred temperature distribution shown in FIG. 1 for a silicon melt as an example differs substantially from the temperature distribution usually encountered to date in the Czochralski method, with the temperature maximum at the crucible wall. In FIG. 1, the temperature at the crucible wall and in the region of the crystallization boundary is only slightly above the melting point of the semiconductor material. The temperature at the crucible wall influences the introduction of oxygen into the melt. The temperature set must therefore be decided from case to case. Temperatures which are up to 25° C., preferably up to 5° C., above the melting point $T_m$ of the semiconductor material have proved useful. The temperature maximum in the region between the single crystal and the crucible wall is preferably 15 to 35° C. above the melting point of the semiconductor material. The distance between the temperature maximum and the crucible wall is preferably 50 to 75% of the distance between the crucible wall and the surface of the single crystal. In order to establish the desired temperature at the crucible wall, the heating power of the resistance heating surrounding the crucible is if necessary reduced before the beginning of the growth of the single crystal. As a result of the relatively low temperature at the crucible wall, the rate at which oxygen and other impurities are dissolved out of the crucible material is considerably reduced. Furthermore, the contamination of the melt by particles is reduced because the formation and detachment of cristobalite islands at the crucible wall also decline at lower temperatures.

A desirable embodiment of the invention is based upon reducing the heating power of the resistance heating to such an extent that a thin layer of semiconductor material crystallizes out on the crucible wall, with the result that the introduction, originating from the crucible, of particles, oxygen and other impurities into the melt is completely suppressed. Single crystals which are prepared by this process variant have, with respect to purity and oxygen content, product properties which are comparable with those of float zone grown crystals.

The additional use of the second, but static, magnetic field during the growth of the single crystal stabilizes and controls the convective material flows, produced mainly by the alternating magnetic field, in the melt and damps local fluctuations of temperature and material flow velocities. The influence of the static magnetic field helps to even out the concentrations of dopants, oxygen and other impurities, especially in the region of the crystallization boundary, and thus also promotes the uniform incorporation of these substances into the growing single crystal. In addition, it has a calming effect on the melt in the region of the crucible wall and thus also helps to ensure that the transfer of oxygen and other impurities to the melt is reduced. It is preferable to set up a static magnetic field which has a magnetic induction $B_c=B_r^2+B_z^2$ whose magnitude is equal to or greater than 0.05 T, where $B_r$ and $B_z$ are the radial and axial components of the magnetic induction with respect to the axis of rotation of the crucible. The field lines of the static magnetic field may pass through the crucible and the melt axially ($B_r=0$; $B_z>0$), transversely ($B_r>0$; $B_z=0$) or axially-radially ($B_r>0$; $B_z>0$). The optimum orientation of the field lines is to be determined by preliminary experiments, since it may differ depending on the desired crystal specification.

In another embodiment of the process, the alternating magnetic field is also used for melting solid semiconductor material in the crucible. Preferably, a part of the required energy of fusion is provided by the resistance heating and another part via the inductive route by the alternating magnetic field. This has the advantage that the quartz glass crucible is protected and the life of the reusable, expensive supporting crucible is increased because the heat radiation which is emitted by the resistance heating and to which the supporting crucible is also exposed can be reduced during the melting process itself. In particular, however, the melting time is substantially shortened and the introduction of impurities into the melt is reduced. Moreover, the homogenization of the melt caused by the action of the alternative magnetic field begins at as early a stage as the melting of the semiconductor material. These advantages can be utilized at the beginning of the process in order to melt solid semiconductor material with which the crucible has been filled, and optionally also subsequently to melt semiconductor material which is then added continuously or batchwise to the existing melt, for example in the form of granules.

A preferred embodiment of the process comprises essentially the process steps described below. The solid semiconductor material initially introduced into the crucible, optionally together with dopant, is first heated with the aid of the resistance heating until sufficient energy transfer is also possible via the alternating magnetic field. Further heat is then supplied jointly by the resistance heating and the alternating magnetic field, the heating power of the resistance heating optionally being reduced according to the energy contribution of the magnetic field. After all the material has melted and the crucible is filled with the melt up to a certain melt height, the static magnetic field is additionally applied to the melt and drawing of the single crystal is begun, optionally after a certain waiting time and a reduction in the heating power of the resistance heating. The seed crystal is immersed in the melt and is drawn upward away from the surface of the melt in the usual manner at a certain velocity, the single crystal growing on its lower end. The crucible and single crystal preferably rotate in opposite directions at certain speeds. The crystal growth passes through the known phases, during which the thin neck, initial cone, cylindrical part and final cone of the single crystal are grown. It is preferable to respond to the continuous decrease in the available melt volume as a result of the growth of the single crystal by a change in the amplitude of the magnetic induction $B_a$ of the alternating magnetic field. The change is particularly preferably effected as a function of the decreasing melt height, according to the equation $B_a = B_{ao} h_o / h$, where $B_a$ is the altered amplitude, $B_{ao}$ is the initial amplitude, $h$ is the actual melt height and $h_o$ is the initial melt height.

The invention also relates to an apparatus for the growth of a single crystal from semiconductor material by the Czochralski method, having a receptacle in which a melt-filled crucible and a resistance heating surrounding the crucible are housed, having a drawing means for growing a single crystal from the melt and having a magnetic means for generating a magnetic field in the melt, characterized in that the magnetic means comprises at least two coils which are arranged around the crucible, one coil generating a static magnetic field and the other coil an alternating magnetic field.

Figure 2:
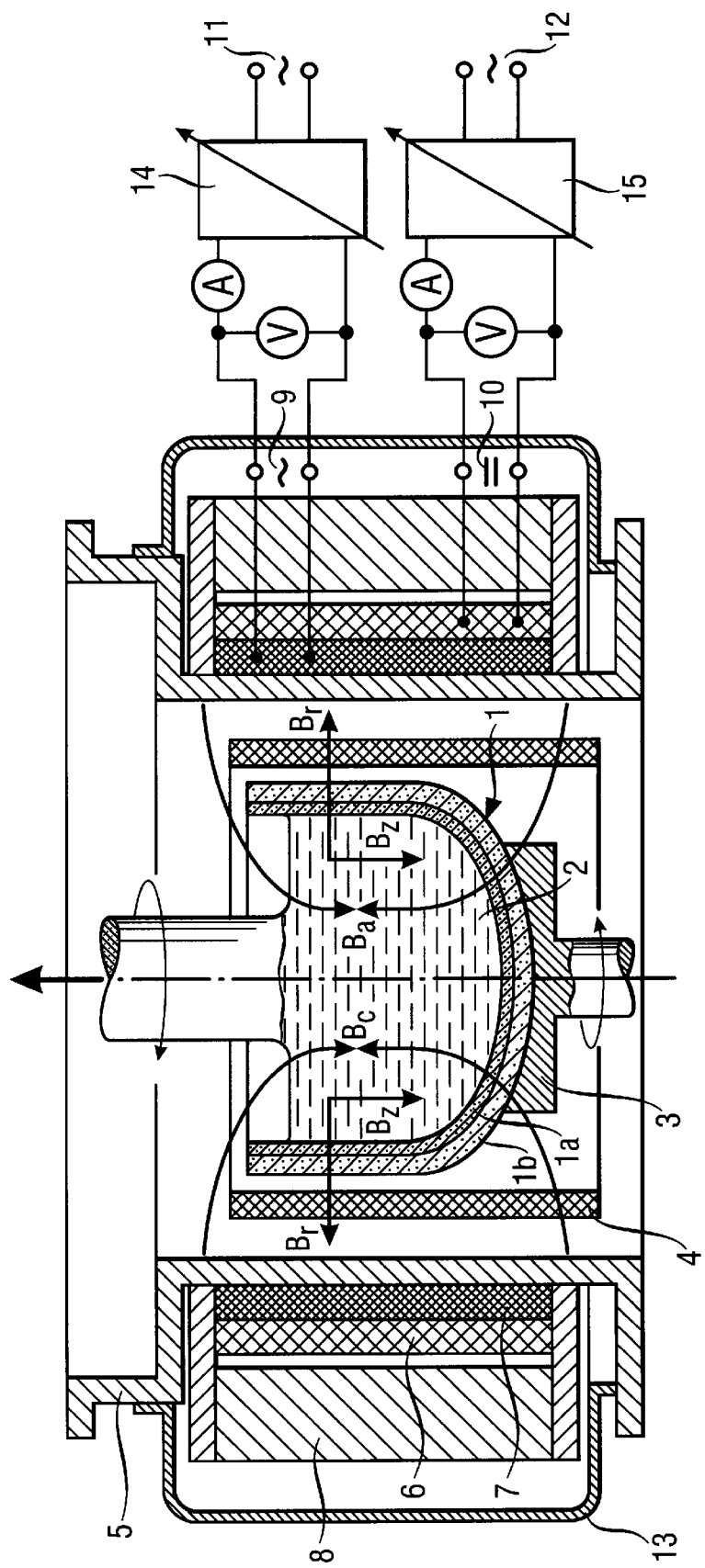
FIG. 2 shows an apparatus according to a first embodiment of the invention for carrying out the process of the invention.

Such an apparatus is shown schematically in FIG. 2, which shows only the features required for understanding the invention. The crucible 1 comprises an inner crucible 1a made of quartz glass and an outer support crucible 1b. The inner crucible 1a filled with the melt 2 is present in the receptacle 5. The crucible 1 is coaxially surrounded by a resistance heating 4 and rests on a rotatable and axially displaceable shaft 3. Conventional heat shields are present between the resistance heating and the receptacle wall but are omitted from FIG. 2 for the sake of greater clarity. An essential feature of the apparatus is the means which generates the magnetic field and comprises essentially a magnetic system 7 for generating an alternating magnetic field and a magnetic system 6 for generating a static magnetic field and is preferably surrounded by a ring 8 of a magnetic material. It is arranged outside the receptacle 5, around the crucible 1, and has a height which corresponds approximately to the height of the crucible 1. In the simplest case, the magnetic systems 6 and 7 comprise one coil each. The magnetic system 6 is connected via the electrical connection 10 to the adjustable direct current unit 15 and via the power supply 12. The magnetic system 7 is connected via the electrical connection 9 to the adjustable, alternating current unit 14 and fed via the power supply 11. A protective cover 13 screens the magnetic means from the outside.

Figure 3:
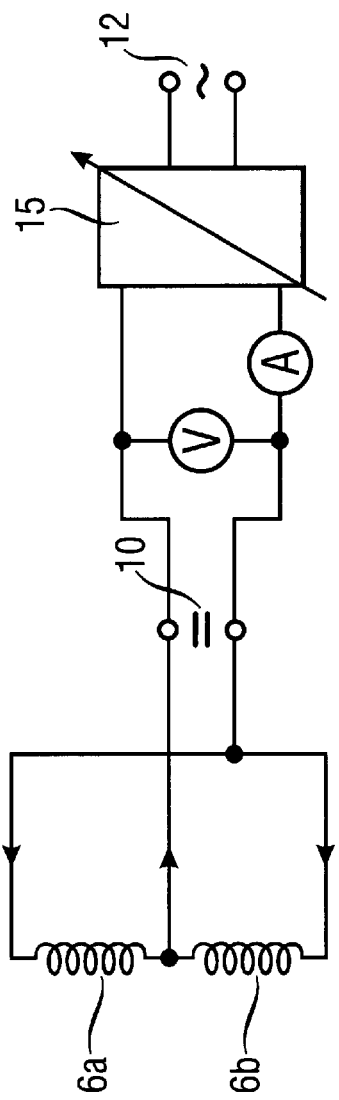
FIG. 3 shows a schematic electrical diagram of an apparatus according to a second embodiment of the invention.

FIG. 3 shows a schematic electrical diagram of an apparatus according to a second embodiment of the invention. The apparatus differs from the apparatus shown in FIG. 2 by the static magnetic system. The magnetic system 6 comprises two coils 6a and 6b having an equal number of windings and being connected to the adjustable current unit 15 and fed via the power supply 12. The coils 6a and 6b are placed above each other and fed with electric current of mutually opposite direction in order to generate two magnetic fields which have opposite directions to each other.

Figure 4:
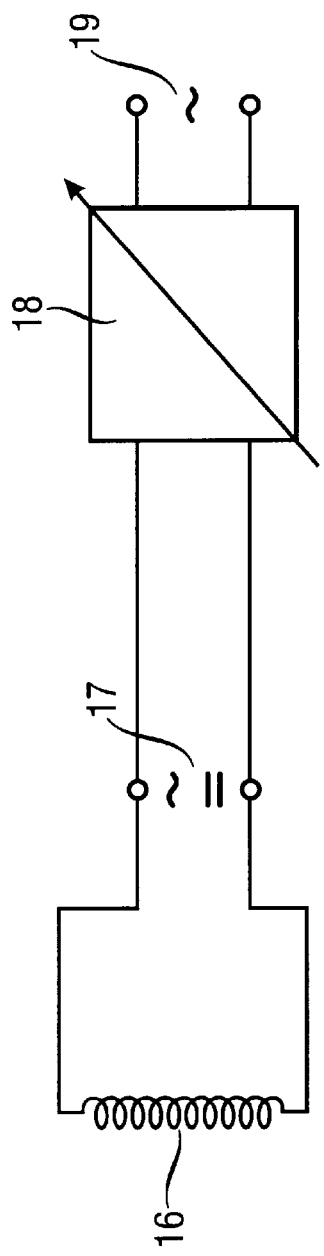
FIG. 4 shows a schematic electrical diagram of an apparatus according to a third embodiment of the invention.

FIG. 4 shows a schematic electrical diagram of an apparatus according to a third embodiment of the invention. The apparatus differs from the apparatus shown in FIG. 2 by the magnetic systems. The two systems of FIG. 2 are combined in a single coil 16 which is connected via the electrical connection 17 to the dc/ac converting unit 18 and fed via the power supply 19. The coil 16 which is fed by a modulated direct current generates a combination of a static and alternating field in the melt.

Other objects and features of the present invention will become apparent from the following Examples, which disclose the embodiments of the present invention. It should be understood, however, that the Examples are designed for the purpose of illustration only and not as a definition of the limits of the invention.

EXAMPLES

The quartz glass crucible of an apparatus structure according to FIG. 2 and intended for the preparation of single crystals was filled with 4.6 kg of silicon and 96 mg of a phosphorus/silicon alloy having a specific conductivity of about $2 \cdot 10^{-3}$ Ω·cm. The receptacle was then evacuated and was flushed with a constant argon stream at a pressure of 10 mbar. The resistance heating was then switched on and the crucible was rotated at 5 revolutions per minute. The coil for generating the alternating magnetic field was connected to the alternating current source about 30 minutes later. Since the voltage source provided an a.c. voltage of 150 Hz, the coil generated an alternating magnetic field in the crucible whose relative frequency ε was about 15. The alternating current frequency had been chosen so that the amplitude $B_a$ of the magnetic induction had a value of 0.02 T. After all the material in the crucible had been melted, the melt was left for a further 10 minutes with the heat supply unchanged, in order to achieve complete homogenization of the melt. The magnetic system for generating the static magnetic field was then also connected and its direct current supply slowly increased until a magnetic induction $B_c = 0.1$ T was reached.

Before the seed crystal was immersed in the melt, the heating power of the resistance heating was reduced to 15 kW. The single crystal was then grown in the usual manner, with drawing of the thin neck, of the initial cone, of the cylindrical part and of the final cone of the single crystal. During drawing of the cylindrical part having a diameter of 80 mm and a length of 250 mm, the single crystal rotated at a speed of 15 revolutions per minute. The pull rate during this phase was 2 mm/min. As the melt height decreased, the amplitude $B_a$ of the magnetic induction of the alternating magnetic field was increased from 0.02 T to 0.04 T by completion of the single crystal.

The analysis of the cylindrical part of the cooled single crystal gave a fluctuation of 8% in the axially measured resistivity. Further results of measurements on single crystals prepared according to the invention are listed in the Table below. Corresponding results for single crystals which were prepared according to the Example but without the influence of a magnetic field (No. 1) or only with the influence of a static (No. 2) or alternating (No. 3) magnetic field are also listed for comparison. In the following Table, $B_{ao}$ denotes the amplitude of the magnetic induction of the alternating magnetic field at the beginning of the growth of the single crystal, $B_c$ denotes the magnetic induction of the static magnetic field, C denotes the mean oxygen concentration at the axial position g* in the single crystal, ΔC denotes the radial fluctuation of the oxygen concentration and Δσ denotes the radial fluctuation of the dopant distribution. The parameter g* indicates the relative axial position of measurement. It is defined as g/G, where g is the mass crystallized up to this position and G is the mass of the melt.

TABLE

| No. | $B_{ao}$ [T] | $B_c$ [T] | g* | C [at/cm3] · $10^{-17}$ | dC [%] | Δs [%] |
|---|---|---|---|---|---|---|
| 1 | 0 | 0 | 0.08 | 10.8 | 11.5 | 7.2 |
|   |   |   | 0.25 | 9.9 | 5.3 | 9.1 |
|   |   |   | 0.55 | 9.5 | 8.8 | 8.8 |
|   |   |   | 0.8 | 8.2 | 10.4 | 11.3 |
| 2 | 0 | 0.1 | 0.07 | 8.2 | 8.5 | 6.7 |
|   |   |   | 0.25 | 7.5 | 7.0 | 7.4 |
|   |   |   | 0.5 | 6.8 | 5.8 | 6.4 |
|   |   |   | 0.8 | 7.4 | 6.2 | 6.5 |
| 3 | 0.03 | 0 | 0.08 | 10.1 | 7.2 | 5.0 |
|   |   |   | 0.3 | 9.5 | 6.5 | 5.4 |
|   |   |   | 0.6 | 10.6 | 6.1 | 5.7 |
|   |   |   | 0.8 | 9.8 | 5.8 | 5.6 |
| 4 | 0.04 | 0.1 | 0.07 | 2.8 | 2.4 | 2.0 |
|   |   |   | 0.25 | 3.2 | 2.7 | 2.4 |
|   |   |   | 0.5 | 3.4 | 3.1 | 2.7 |
|   |   |   | 0.8 | 3.6 | 3.2 | 2.6 |
| 5 | 0.005 | 0.1 | 0.08 | 4.8 | 4.7 | 4.7 |
|   |   |   | 0.3 | 5.5 | 5.2 | 4.1 |
|   |   |   | 0.6 | 5.8 | 5.4 | 5.2 |
|   |   |   | 0.8 | 6.2 | 6.6 | 5.4 |
| 6 | 0.015 | 0.1 | 0.08 | 3.1 | 2.7 | 2.8 |
|   |   |   | 0.25 | 3.4 | 2.4 | 2.6 |
|   |   |   | 0.5 | 3.5 | 2.4 | 2.1 |
|   |   |   | 0.8 | 3.5 | 2.6 | 2.4 |

The measured values clearly show the improvements which are to be expected with regard to the homogeneity of the dopant and oxygen distribution with the use of a combination of an alternating and a static magnetic field. They also show that low oxygen concentrations can be established in a controlled manner in single crystals.

While several embodiments of the present invention have been shown and described, it is to be understood that many changes and modifications may be made thereunto without departing from the spirit and scope of the invention as defined in the appended claims.

What is claimed is:

1. Process for the growth of a single crystal from a melt of semiconductor material by the Czochralski method comprising drawing a seed crystal immersed in said melt away from a surface of the melt, the melt being present up to a certain height in a rotatable quartz glass crucible and being produced by melting solid semiconductor material and optionally dopants, causing growth of said single crystal, and subjecting said melt to the influence of a magnetic field during growth of said single crystal, said magnetic field being generated by superposing a static magnetic field and an alternating magnetic field.

2. Process according to claim 1, wherein the static magnetic field has a magnetic induction $B_c=B_r^2+B_z^2$ whose magnitude is equal to or greater than 0.05 T, $B_r$ being the radial component and $B_z$ being the axial component of the magnetic induction with respect to an axis of rotation of the crucible and the static magnetic field being oriented axially, transversely or axially-radially.

3. Process according to claim 1, wherein the alternating magnetic field has a relative frequency $\epsilon=2\pi\mu_o\sigma fR^2$ which is in the range from 1 to 1000 and has a magnetic induction with an amplitude of at least $B_a=C/R$, where $\mu_o$ denotes the magnetic permeability in vacuo ($\mu_o=4\pi10^{-7}$ H/m) and σ denotes the electrical conductivity of the melt, f denotes the alternating current frequency of the power supply of the magnet and R denotes the radius of the crucible and C is a constant whose value is $1\cdot10^{-3}$ T·m.

4. Process according to claim 1, wherein a decrease in the melt height which occurs during drawing of the single crystal is responded to by a change in the amplitude of the magnetic induction of the alternating magnetic field according to the equation $B_a=B_{ao}\cdot h_o/h$ where $B_a$ is the changed amplitude, $B_{ao}$ is the initial amplitude, h is the actual melt height and $h_o$ is the initial melt height.

5. Process according to claim 1, wherein the alternating magnetic field has a relative frequency $\epsilon=2\pi\mu_o\sigma fR^2$ which is in the range from 1 to 1000 and has a magnetic induction with an amplitude of at least $B_a=C/R$, where $\mu_o$ denotes the magnetic permeability in vacuo ($\mu_o=4\pi10^{-7}$ H/m) and μ denotes the electrical conductivity of the melt, f denotes the alternating current frequency of the power supply of the magnet and R denotes the radius of the crucible and C is a constant whose value is $1\cdot10^{-3}$ T·m, and the incorporation of oxygen into the single crystal is controlled via the amplitude of the magnetic field and the relative frequency $\epsilon$.

6. Process according to claim 1, comprising melting the solid semiconductor material, before beginning of drawing of the crystal, by resistance heating and by the alternating magnetic field.

7. Process according to claim 1, comprising adding solid semiconductor material to the crucible during drawing of the single crystal; and melting said solid semiconductor material by resistance heating and by the alternating magnetic field.

8. Process according to claim 1, comprising applying to the melt, by resistance heating and by the superposed magnetic fields, a radial temperature profile which has a temperature maximum between the single crystal and a crucible wall and provides, at a crucible wall and in the region of a crystallization boundary, temperatures which are only slightly above the melting point of the semiconductor material, during growing of the single crystal.

9. Process according to claim 1, comprising applying to the melt, by resistance heating and by the superposed magnetic fields, a radial temperature profile which has a temperature maximum between the single crystal and a crucible wall and provides, at the crucible wall, temperatures which are below the melting point of the semiconductor material, during growing of a single crystal.

10. Apparatus for the growth of a single crystal from semiconductor material by the Czochralski method, comprising a receptacle for housing a melt-filled crucible and a resistance heating means surrounding the crucible;

a drawing means for growing a single crystal from the melt; and a magnetic means for generating a magnetic field in the melt, wherein the magnetic means comprises at least two coils which are arranged around the crucible, one coil being connected to an adjustable direct current unit and generating a static magnetic field and the other coil being connected to an adjustable alternating current unit and generating an alternating magnetic field.

11. Apparatus according to claim 10, wherein the coil generating the static magnetic field comprises two coils having an equal number of windings and being placed above each other, each of said coils generating static magnetic fields which have opposite directions to each other.

12. Apparatus according to claim 10, wherein the magnetic means is surrounded by a ring of magnetic material.

13. Apparatus for the growth of a single crystal from semiconductor material by the Czochralski method, comprising a receptacle for housing a melt-filled crucible and a resistance heating means surrounding the crucible;

a drawing means for growing a single crystal from the melt; and a magnetic means for generating a magnetic field in the melt, wherein the magnetic means comprises at least one coil which is connected to a dc/ac converting unit and in which a combined static and alternating magnetic field is generated by a modulated direct current.

14. Apparatus according to claim 13, wherein the magnetic means is surrounded by a ring of a magnetic material.

15. Process according to claim 3, wherein the alternating magnetic field has a relative frequency which is in the range from 5 to 50.

16. Process according to claim 5, wherein the alternating magnetic field has a relative frequency which is in the range from 5 to 50.

17. Process for the growth of a single crystal from a melt of semiconductor material by the Czochralski method comprising drawing a seed crystal immersed in said melt away from a surface of the melt, the melt being present up to a certain height in a rotatable quartz glass crucible and being produced by melting solid semiconductor material and optionally dopants, causing growth of said single crystal, and subjecting said melt to the influence of a magnetic field during growth of said single crystal, said magnetic field being generated first by an alternating magnetic field and then by superposing a static magnetic field onto said alternating magnetic field.

* * * * *